United States Patent
Chao et al.

[11] Patent Number: 6,107,206
[45] Date of Patent: Aug. 22, 2000

[54] METHOD FOR ETCHING SHALLOW TRENCHES IN A SEMICONDUCTOR BODY

[75] Inventors: Li-Chih Chao, Yang-mei; Chao-Cheng Chen, Matou, both of Taiwan

[73] Assignee: Taiwan Semiconductor Manufacturing Company, Hsin-Chu, Taiwan

[21] Appl. No.: 09/152,350

[22] Filed: Sep. 14, 1998

[51] Int. Cl.[7] ................ H01L 21/302; H01L 21/461
[52] U.S. Cl. ................ 438/706; 438/710; 438/719; 438/720; 438/721
[58] Field of Search .................. 438/706, 724, 438/221, 432, 248, 710, 719, 720

[56] References Cited

U.S. PATENT DOCUMENTS

| | | | |
|---|---|---|---|
| 4,104,086 | 8/1978 | Bondur et al. | 148/1.5 |
| 4,310,380 | 1/1982 | Flamm et al. | 156/643 |
| 4,436,584 | 3/1984 | Bernacki et al. | 156/643 |
| 4,690,729 | 9/1987 | Douglas | 156/643 |
| 4,855,017 | 8/1989 | Douglas | 156/643 |
| 5,034,342 | 7/1991 | Sidner et al. | 437/67 |
| 5,068,202 | 11/1991 | Crotti et al. | 437/67 |
| 5,244,535 | 9/1993 | Ohtsuka et al. | 437/195 |
| 5,298,790 | 3/1994 | Harman et al. | 257/622 |
| 5,707,486 | 1/1998 | Collins | 156/643.1 |
| 5,792,304 | 8/1998 | Tamura et al. | 156/345 |
| 5,863,706 | 1/1999 | Komatsu et al. | 438/706 |
| 5,900,163 | 5/1999 | Yi et al. | 216/79 |

*Primary Examiner*—Richard Elms
*Assistant Examiner*—Michael S. Lebentritt
*Attorney, Agent, or Firm*—George O. Saile; Stephen B. Ackerman; Wolmar J. Stoffel

[57] ABSTRACT

A method of etching closely spaced trenches in a silicon body wherein a masked silicon body is introduced into a plasma etching apparatus. An object having an exposed silicon surface that is consumable by a plasma environment is provided in the apparatus. A reactive plasma environment is established in the apparatus which removes silicon from the body and the silicon object. The additional silicon from the object in the plasma influences the silicon removal from the body to thereby provide tapered trench side walls.

20 Claims, 2 Drawing Sheets

METHOD FOR ETCHING SHALLOW TRENCHES IN A SEMICONDUCTOR BODY

BACKGROUND OF THE INVENTION

The invention relates to fabrication of semiconductor devices, more particularly to the etching of shallow isolation trenches in monocrystalline silicon substrates.

The fabrication of trenches in semiconductor substrates of integrated circuit devices that have an aspect ratio (depth to width ratio) greater than 1 to 1 is useful in several areas of ULSI (ultra large scale integration) processing. Trench etch processing has become critical to the fabrication of state-of-art electronic devices exploiting three dimensional structural concepts such as trench capacitors, trench isolation, and trench transistors.

Currently, shallow trench isolation (STI) uses $Cl_2$/HBr reactive ion etching to form trenches in masked monocrystalline silicon substrates. The trenches most desirably have smooth planar trench walls that slope inwardly in order to avoid void formations in the materials used to fill the trenches. The trenches are normally filled using chemical vapor deposition refill operations. Desirably, the slope of the trench walls will be less than approximately 85 degrees to avoid void formations, and greater than 75 degrees to conserve area on the device. The trench wall slope is defined as the complementary angle of the angle between the trench wall and the horizontal flat trench floor.

As the semiconductor devices become more microminiturized, the isolation trenches have become smaller and more narrow. This microminiturization resulted in serious problems in controlling the trench wall slope and the planarity of the walls.

Various methods and etching apparatus are known for controlling the profile and shape of etched trenches in semiconductor bodies. U.S. Pat. No. 5,298,790 discloses an etching process wherein and etching mask, which includes a layer of polysilicon that will absorb non-vertically traveling ions, is provided to influence the resultant trench profile. U.S. Pat. No. 4,690,729 discloses a method for etching trenches in a silicon body wherein an enchant mask is provided that includes silicon oxides. During etching, the silicon oxides of the mask are deposited on the resultant trench side walls and influence the etching action. U.S. Pat. No. 4,855,017 discloses a method for etching trenches in a silicon body. In the method, material is selectively deposited on the trench side walls during etching by including various agents in the plasma that will react with the silicon and form etch products that deposit on the trench walls. These deposits influences the etching action of the plasma to form the desired trench profile. U.S. Pat. No. 5,707,486 discloses a plasma reactor for etching various materials. The reactor has an electrode structure that defines the plasma generating field.

SUMMARY OF THE INVENTION

An object of the invention is to decrease the etching profile angle for small trench etching.

Another object of the invention is to provide a method to decrease the etching profile angle for low clear ratio [(1-Mask cover area)/(total wafer area)] shallow trench etching.

Yet another object of the invention is to provide an etching method for forming shallow isolation trenches wherein the etching profile angle can be controlled.

Still another object of the invention is to provide a reactive ion etching method wherein the profile angle of the trench wall can be controlled when the trenches are very narrow and/or the clear ratio is low.

The present invention is a method for etching closely spaced trenches in a silicon body, which trenches have sloping side walls. In the method, a silicon body, with a surface masking layer with openings that define closely spaced isolation trenches, is introduced into a plasma etching apparatus. A silicon object having an exposed silicon surface that is consumable in a plasma environment is provided within the apparatus. A reactive plasma environment is established within the apparatus that removes silicon from the silicon body through the mask openings, and silicon from the silicon object. The silicon from the object influences the silicon removed from the body thereby resulting in tapered side walls on the resultant trenches.

BRIEF DESCRIPTION OF THE DRAWINGS

The present invention will be described with reference to the accompanying drawings, wherein.

DESCRIPTION OF THE PREFERRED EMBODIMENTS

Figure 1:
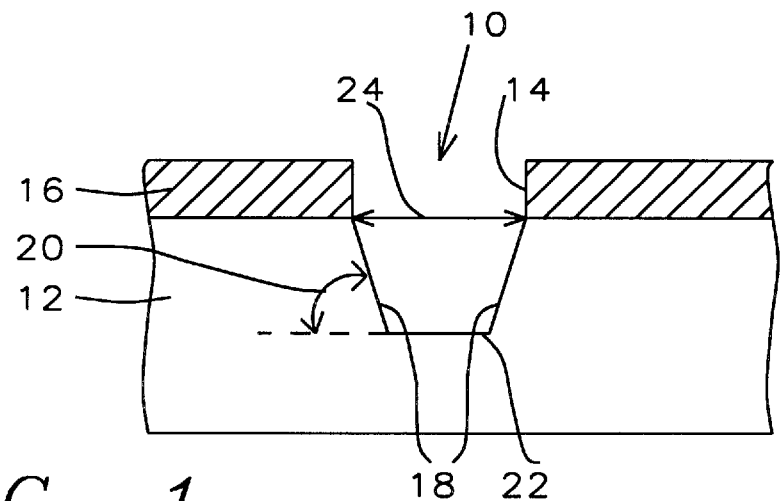
FIG. 1 is a profile view of a typical trench, in greatly enlarged scale, used in the fabrication of trench isolation structures for semiconductor devices.

The present invention is a method for controlling the slope of a trench wall during a reactive ion etching process in the fabrication of very small semiconductor devices utilizing filled trench isolation. Referring to FIG. 1, there is illustrated a trench 10 that has been etched into a monocrystalline silicon substrate 12 through an opening 14 in mask 16. As indicated, the side walls slope inwardly forming a tapered trench. In semiconductor processing, a trench with sloping side walls can be filled with an insulating material, usually using CVD processes, with less probability of forming voids in the insulating material. Also, the trench walls should be flat, without an undercut beneath the edges of the mask. However, if the slope of the trench side walls is too great, the isolation trenches will take up too much area on the device surface. The slope of the side walls is indicated by angle 20 in FIG. 1, as the complimentary angle of the angle formed by the side wall 18, and trench bottom surface 22. A trench with vertical side walls will have a slope of 90 degrees. A trench with tapered side walls will have a slope less than 90 degrees. A trench for a trench isolation structure will preferably have a slope in the range of 70 to 85 degrees.

It has been discovered that as the size of the device geometry gets increasingly smaller, the slope of the trench walls, produced by reactive ion etching gets greater, approaching the vertical. The factors that affect the trench wall slope have been discovered to be (1) the width of the trenches, and (2) the pattern density of the mask used to form the trenches. The trench width is indicated in FIG. 1 as the dimension 24, The pattern density D is given by the formula D=(photoresist mask cover area)/(total wafer area). It has been discovered that in order to produce microminiturized trenches with walls having a slope in the range of 70° to 85° the trench width must be in the range of 0.3 μm and below, when the clear ratio (% of surface not covered by photoresist) is less than 60%.

As is illustrated by the Examples 1 and 2 that follow, the etching profile angle of the trench walls depends on the trench width and the clear ratio. Since silicon is believed to be the source of passivation that generates the taper etching profile, we propose to add consumable silicon in the etching chamber to increase the passivation source for trench etching for small trench widths and spacing, and low clear ratio applications.

Figure 2:
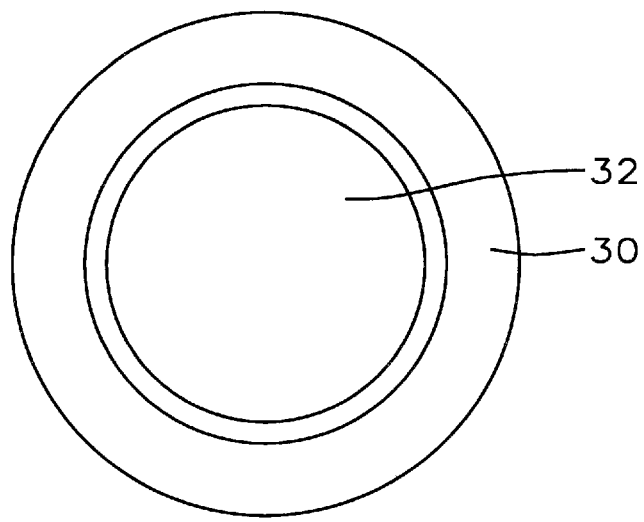
FIG. 2 shows a substrate support 30 that supports a wafer 32 on its top surface.
Figures 3A, 3B:
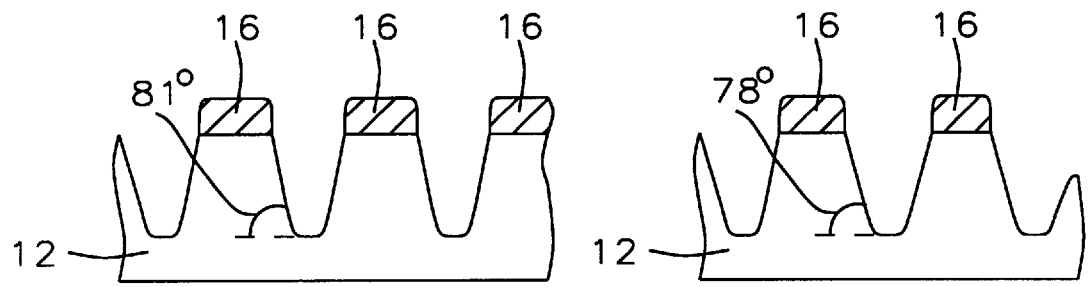
FIGS. 3a, 3b, and 3c are profile views of trenches that are associated with examples in the specification.
Figure 3C:
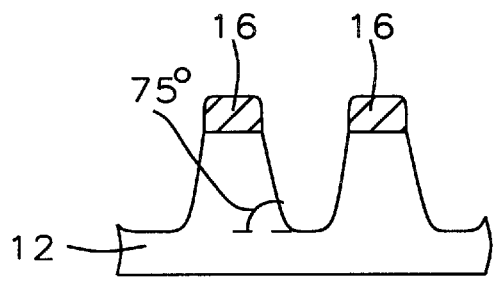
Figure 4A:
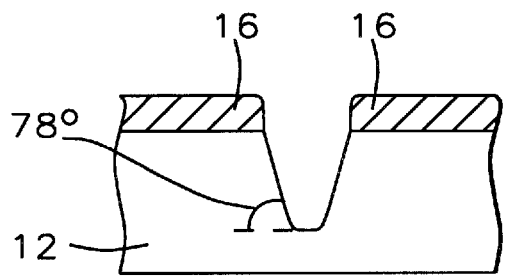
FIGS. 4a, and 4b are profile views of trenches that are associated with examples in the specification.
Figure 4B:
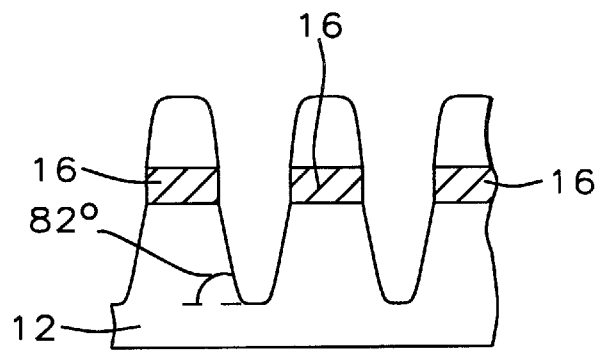

Referring now to FIG. 2, there is illustrated a method and structure for increasing the silicon during etching. FIG. 2 shows a substrate support 30 that supports a wafer 32 on its top surface. Support 30 can be formed of silicon, or more conveniently be formed of glass with a surface layer of polysilicon. The wafer 32 can be secured to the support 30 if desired, possibly with electrostatic techniques.

EXAMPLE 1

Three monocrystalline silicon substrates were each masked with a photoresist layer. The layers were all exposed and cured to form trench openings of various widths. The first mask layer openings were 0.30 um in width. The second mask layer openings were 0.35 um in width. The third mask layer openings 0.40 um in width. All of the substrates were reactive ion etched in a reactive plasma environment defined as follows:

50 mT/900 w 30 G/100 HBr 10 $Cl_2$ 40 $HeO_2$ 15 $CF_4$/10 s 80 mT/900 w 30 G/100 HBr 10 $Cl_2$ 40 $HeO_2$ 15 $CF_4$/10 s 100 mT/900 w 30 G/100 HBr 10 $Cl_2$ 40 $HeO_2$ 15 $CF_4$/10 s (note: $HeO_2$ is $O_2$ diluted in He—to enable good control of low $O_2$ flow rate)

The substrates were removed from the apparatus, and sectioned to reveal the trench profiles. The first substrate trenches, with a width of 0.30 um, had walls with a slope of 81 degrees. The second substrate trenches, with a width of 0.35 um, had walls with a slope of 78 degrees. The third substrate trenches, with a width of 0.40 um had a slope of 75 degrees. The depth of the trenches was 3.5 K Å. The pattern density of the masks were approximately the same, on the order of 70%. These results indicate that as the trench widths increase, the slope of trench wall increases. This example illustrates the problem facing the semiconductor industry, i.e. the increasing of trench wall slope as the geometry becomes smaller.

EXAMPLE 2

Two monocrystalline silicon substrates were masked with a masking layer that defined trenches of approximately equal width. The pattern of the openings on the first substrate had a clear ratio of 65%. The clear ratio on the second wafer was 50%. The trench width on both wafers was 0.40 um. The substrates were placed in a reactive ion etch apparatus and exposed to a reactive plasma environment defined as follows:

50 mT/800 w 30 g/100 HBr 20 $Cl_2$ 30 $HeO_2$ 20 $CF_4$/8 s
80 mT/750 w 30 g/100 Br 20 $Cl_2$ 30 $HeO_2$ 20 $CF_4$/8 s
100 mT/750 w 30 g/100 HBr 20 $Cl_2$ 30 $HeO_2$ 20 $CF_4$/44 s

The substrates were removed and sectioned, as in Example 1. The first substrate trenches, with a clear ratio of 65%, had a slope of 78 degrees. The second substrate trenches, with a clear ratio (% of surface covered by photoresist or [(1-mask cover area)/total wafer area]) of 50%, had a slope of 82 degrees. This Example illustrates that as the clear ratio is decreased, the slope of the trench walls increase.

EXAMPLE 3

Three substrates are masked as in Example 1, using the same mask with similar sized openings. The substrates are placed in a reactive etching apparatus, as in Example 1 but with the substrates placed on a substrate holder, made of glass, with a coating layer of polycrystalline silicon. The substrate holder is indicated in FIG. 2, and has an exposed silicon surface area on approximately 140 $cm^2$. The reactive plasma is similar to the one described in Example 1. After the etching was complete and the substrates sectioned, the following results is obtained.

|  | Trench Width | Slope | Slope as in Ex. 1 |
|---|---|---|---|
| #1 Substrate | 0.30 μm | 78° | 81 degree |
| #2 Substrate | 0.35 μm | 75° | 78 degree |
| #3 Substrate | 0.40 μm | 72° | 75 degree |

The above comparison illustrates the advantages of the invention.

While preferred embodiments of the present invention and their advantages have been set out in the above description, the invention is no limited thereto, but only by the spirit and scope of the appended claims.

We claim:

1. A method of etching closely spaced trenches in a silicon body, said trenches having sloping side walls, the method comprising, introducing a monocrystalline silicon semiconductor body, with a surface masking layer with openings that define closely spaced shallow isolation trenches, into a plasma etching apparatus, providing a silicon object having an exposed silicon surface that is consumable by a plasma environment within the apparatus, establishing a reactive plasma environment within the apparatus that removes silicon from the semiconductor body through said openings in said masking layer and also silicon from said silicon object, said plasma influenced by the silicon removed from said object to thereby provide tapered side walls in the resultant trenches.

2. The method of claim 1 wherein said openings have a width less than 0.30 μm.

3. The method of claim 2 wherein said openings have a width in the range of 0.2 to 0.3 μm.

4. The method of claim 1 wherein said masking layer has a clear ratio, defined by [1-(photo resist cover area)/(total wafer area)] that is less than 60%.

5. The method of claim 4 wherein said clear ratio is in the range of 10% to 60%.

6. The method of claim 1 wherein said silicon object is a wafer support holder having a peripheral area surrounding said semiconductor body that has at least a surface layer of silicon.

7. The method of claim 6 wherein said silicon object is formed of glass with a layer of polycrystalline silicon on the surface.

8. The method of claim 6 wherein the ratio of the surface area of the wafer to the peripheral surface area of the silicon object is in the range of 0.5 to 1.0.

9. The method of claim 2 wherein the slope of the resultant side walls of the trenches is less than 85 degrees.

10. The method of claim 9 wherein the slope range of the resultant side walls of the trenches is in the range of 70 to 85 degrees.

11. The method of claim 1 wherein said etching is achieved with a plasma environment which includes HBr, $Cl_2$, He, $O_2$, and $CF_4$.

12. The method of claim 11 wherein an electric field is established within the etching apparatus that has its axis perpendicular to the surface plane of the semiconductor body.

13. The method of claim 2 wherein the masking layer has a clear ratio that is less than 60% resulting in a trench wall slope that is less than 85 degrees.

14. A method of etching closely spaced trenches in a silicon body, said trenches having sloping side walls, the method comprising, introducing a monocrystalline silicon semiconductor body, with a surface masking layer with openings that define closely spaced shallow isolation trenches, into a plasma etching apparatus, providing a silicon object having an exposed silicon surface that is consumable by a plasma environment within the apparatus, establishing a reactive plasma environment within the apparatus that removes silicon from the semiconductor body through said openings in said masking layer and also silicon from said silicon object, said plasma influenced by the silicon removed from said object to thereby provide tapered side walls in the resultant trenches; and said surface masking layer has a clear ratio that is less than 60% resulting in a trench wall slope that is less than 85 degrees.

15. The method of claim 14 wherein said openings have a width less than 0.30 μm; and the slope of the resultant side walls of the trenches is less than 85 degrees.

16. The method of claim 14 wherein said openings have a width in the range of 0.2 to 0.3 μm.

17. The method of claim 14 wherein said masking layer has a clear ratio, defined by [1-(photo resist cover area)/(total wafer area)] that is in the range of 10% to 60%.

18. The method of claim 14 wherein said silicon object is a wafer support holder having a peripheral area surrounding said semiconductor body that has at least a surface layer of silicon; the ratio of the surface area of the wafer to the peripheral surface area of the silicon object is in the range of 0.5 to 1.0.

19. The method of claim 18 wherein said silicon object is formed of glass with a layer of polycrystalline silicon on the surface.

20. The method of claim 14 wherein said etching is achieved with a plasma environment which includes HBr, $Cl_2$, He, $O_2$, and CF; and an electric field is established within the etching apparatus that has its axis perpendicular to the surface plane of the semiconductor body.

* * * * *